United States Patent [19]

Shiraishi

[11] Patent Number: 4,641,175
[45] Date of Patent: Feb. 3, 1987

[54] BIDIRECTIONAL POWER SWITCH WITH OPTIMIZED EMITTER SPACING NEAR CONTROL ELECTRODE

[75] Inventor: Takashi Shiraishi, Yokohama, Japan

[73] Assignee: Tokyo Shibaura Denki Kabushiki Kaisha, Kawasaki, Japan

[21] Appl. No.: 851,893

[22] Filed: Apr. 4, 1986

Related U.S. Application Data

[63] Continuation of Ser. No. 568,914, Jan. 6, 1984, abandoned.

[30] Foreign Application Priority Data

Jan. 18, 1983 [JP] Japan .................................. 58-6414

[51] Int. Cl.⁴ ............................................ H01L 29/747
[52] U.S. Cl. ........................................ 357/39; 357/20; 357/86
[58] Field of Search ........................ 357/20, 38, 39, 86

[56] References Cited

U.S. PATENT DOCUMENTS 3,972,014  7/1976  Hutson .................................. 357/39

FOREIGN PATENT DOCUMENTS 58-118151  7/1983  Japan .
1301193  12/1972  United Kingdom .
1345186  1/1974  United Kingdom .
1390030  4/1975  United Kingdom .

Primary Examiner—Joseph E. Clawson, Jr.
Attorney, Agent, or Firm—Finnegan, Henderson, Farabow, Garrett & Dunner

[57] ABSTRACT

A semiconductor device comprises first to third semiconductor layers of P, N and P conductivity types, first and second emitter regions of an N conductivity type, with predetermined patterns, these emitter regions being formed in the first and third semiconductor layers, and an auxiliary emitter region of an N conductivity type, which region is formed in the third semiconductor layer. The first and second emitter regions are so arranged as to have overlapping portions and a separating portion, these portions being located close to the gate region, as viewed in the laying direction of the layers.

8 Claims, 26 Drawing Figures

BIDIRECTIONAL POWER SWITCH WITH OPTIMIZED EMITTER SPACING NEAR CONTROL ELECTRODE

This application is a continuation of application Ser. No. 06/568,914, filed Jan. 6, 1984, abandoned.

BACKGROUND OF THE INVENTION

The present invention relates to a semiconductor device and, more particularly, to a semiconductor device which serves as a switch device.

A triac, for example, is enumerated for a semiconductor device affected by a gate trigger sensitivity problem. As is well known, the triac has two main electrodes and a single gate electrode which serves as a control gate. According to a combination of bias relations among the two main electrodes and the gate electrode, the triac is switched from an OFF state to an ON state, in one of four gate trigger modes.

A triac operating at the rated values of several hundreds volts or ten and several amperes receives, as a control signal, an output signal from an integrated circuit (IC) device. The output signal of the IC device is generally 10 mA or less. Thus, to drive the triac directly, the minimal value of a gate trigger current $I_{GT}$ capable of turning on the triac must be at least 10 mA for all of the four gate trigger modes. If the current value is insufficient to directly drive the triac, it is necessary to provide an amplifier made of a transistor, for example, between the IC device and the gate electrode of the triac.

To improve a gate trigger's sensitivity, the thickness of the semiconductor layer in contact with the gate electrode is reduced, which also serves to improve the carrier transmitting efficiency. Alternatively, two emitter regions formed on the major surfaces of a wafer may be so positioned as to partially overlap each other, to thereby allow injected carriers to operate effectively. If one of the above measures is taken, a decrease is allowed in the minimum value of the trigger current $I_{GT}$ capable of turning on the triac. In such a case, however, other characteristics, particularly critical off-voltage/unit of time $(dv/dt)_s$ and critical off-voltage/unit of time $(dv/dt)_c$, at the time of commutation, are substantially damaged.

To solve this problem, the semiconductor device with the structure shown in FIGS. 1A to 1C and FIG. 2 has been proposed. As is well illustrated in FIGS. 1B and 1C, first to third semiconductor layers 1 to 3 of P, N and P conductivity types are superimposed one upon another. First and second emitter regions 4,5 of an N conductivity type, with predetermined patterns, are formed in the first and third semiconductor layers 1, 3, as shown. The third semiconductor layer 3 also has an auxiliary emitter region 9 formed thereon.

Figure 1A:
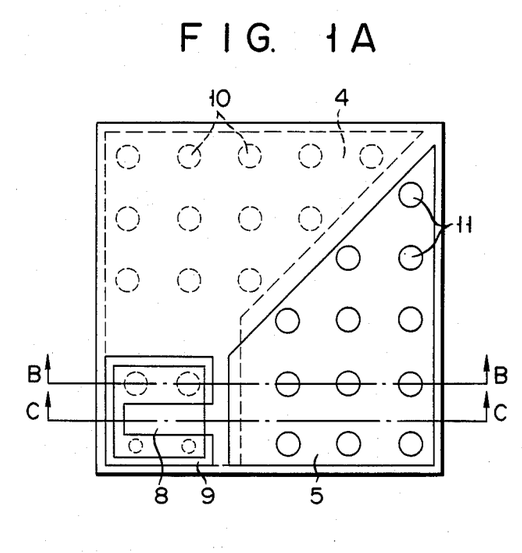
Figure 1B:
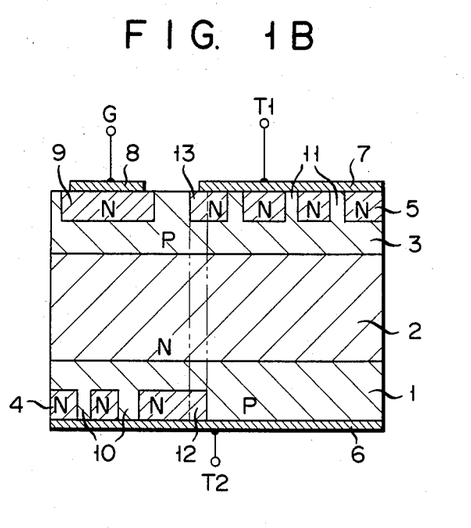
FIGS. 1B and 1C are cross-sectional views taken along lines B—B and C—C of FIG. 1A.
Figure 1C:
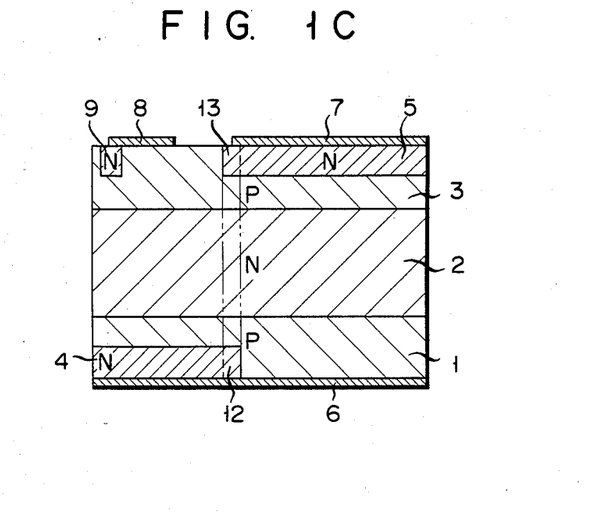
Figure 2:
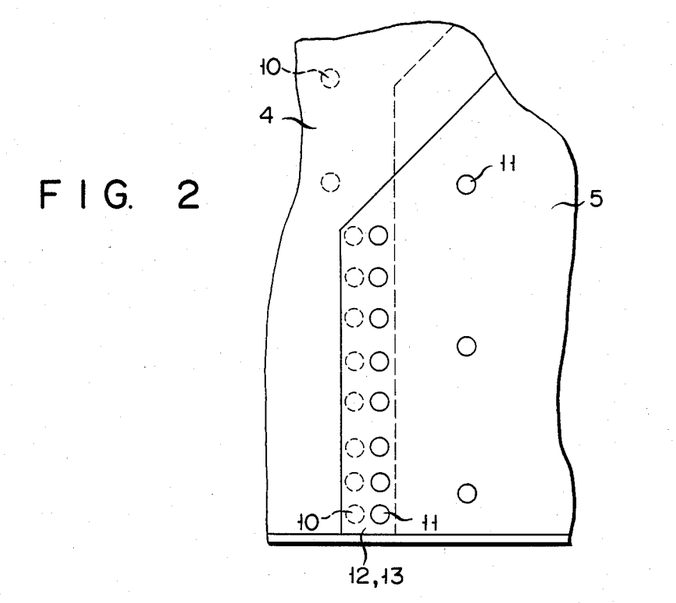
FIG. 2 is an enlarged view of a part of the triac shown in FIGS. 1A to 1C.
Figure 3A:
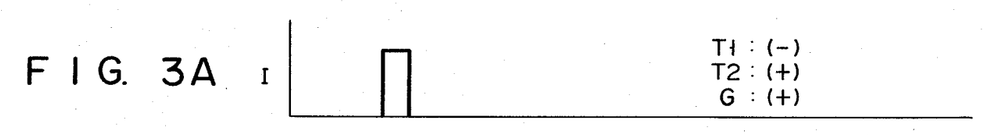
FIGS. 3A to 3D respectively illustrate gate trigger current characteristics in four gate trigger modes I, II, III, IV of the conventional triac shown in FIGS. 1A to 1C.
Figure 3B:
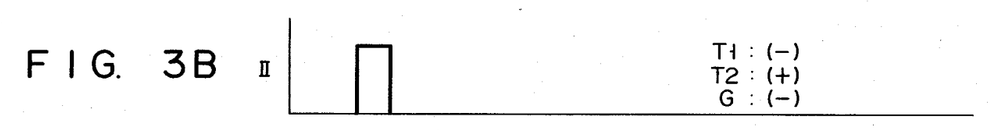
Figure 3C:
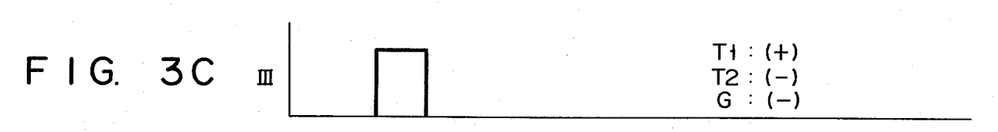
Figure 3D:
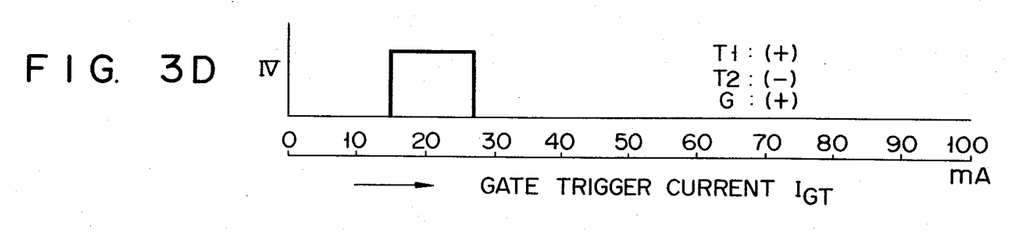

A first main electrode 6 is formed on the exposed major surface of the first semiconductor layer 1. The first main electrode 6 is in contact with the first semiconductor layer 1 and first emitter region 4. A second main electrode 7 is formed on the exposed major surface of the third semiconductor layer 3. The second main electrode 7 is in contact with the third semiconductor layer 3 and second emitter region 5. A gate electrode 8 is formed on the auxiliary emitter region 9. T1 and T2 designate main terminals, and G designates a gate terminal.

The first and second emitter regions 4, 5 are so patterned as to form therein a plurality of islands 10, 11 of the first and second semiconductor layers 1 and 3. Additionally, the first and second emitter regions 4, 5 overlap each other at portions 12 and 13, in the vicinity of the gate region or the gate electrode 8, as viewed in the laying direction of layers 1 to 3. As seen from FIG. 2, the number of islands 10, 11 per unit area in the overlapping portions 12, 13 is larger than that in the non-overlapping portions. For simplicity of illustration, the islands are omitted in the overlapping portions of FIGS. 1A to 1C. Further, in FIG. 1A, the main electrodes 6, 7 are omitted, for the same reason.

In the semiconductor device thus arranged, the presence of the overlapping portions 12, 13 of the first and second emitter regions 4, 5 provides satisfactorily high gate trigger sensitivity. Furthermore, the high density of the islands in the overlapping portions substantially increases the critical off-voltage/unit of time $(dv/dt)_c$ at the time of commutation.

Figure 4A:
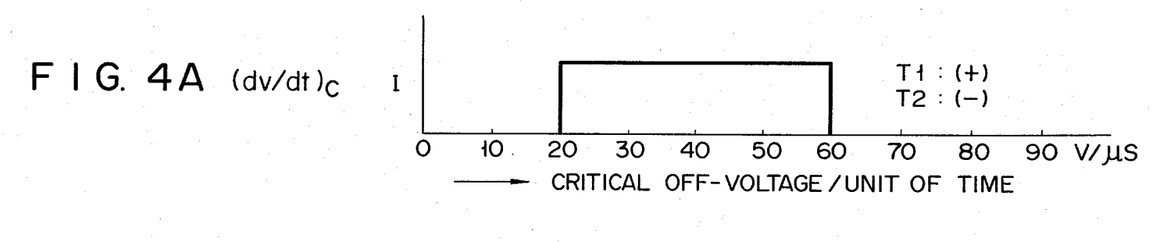
FIGS. 4A and 4B are the critical off-voltage/unit of time $(dv/dt)_c$ at the time of commutation in modes I and III.
Figure 4B:
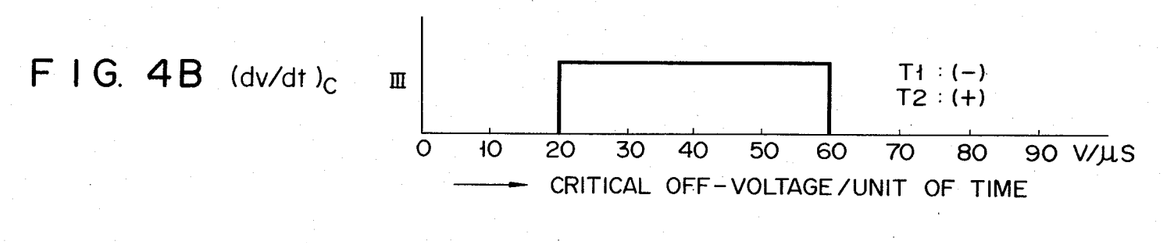
Figure 4C:
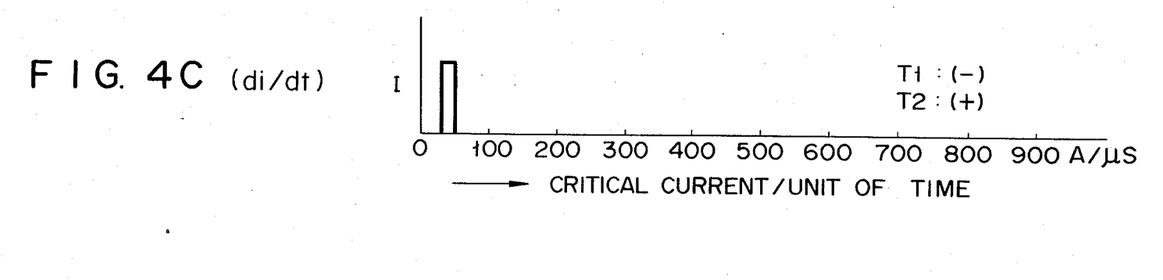
FIG. 4C shows a critical current/unit of time $(di/dt)$ in a gate trigger mode I.

The gate trigger characteristics of the four semiconductor devices arranged as shown in FIGS. 1A–1C and FIG. 2 are illustrated in FIGS. 3A to 3D. When those characteristics are obtained the polarity at terminal G is set relative to the polarity at terminal T1. The critical off-voltage/unit of time $(dv/dt)_c$ at the time of commutation in modes I and III and the critical current/unit of time (di/dt) in mode I are as shown in FIGS. 4A to 4C. As may be seen from those figures, the critical off-voltage/unit of time $(dv/dt)_c$ at the time of commutation in modes I and III is good. When this device is turned off in mode I, T1: (−) and T2: (+), as shown in FIG. 4C, the critical current/unit of time (di/dv) is from approximately 30 to 50 A/μs, which is very poor. The presumed reason for this is that, when a sharply rising current is caused to flow in the above bias mode, it is hard for the device to turn off in the vicinity of the gate region.

Ideally, in the semiconductor device serving as a switch device, the characteristics $(dv/dt)_c$ at the time of commutation in modes I and III and the characteristic (di/dt) in mode I should all be satisfactory.

SUMMARY OF INVENTION

Accordingly, a primary object of the present invention is to provide a semiconductor device with improved gate trigger sensitivity in four gate trigger modes, the critical off-voltage/unit of time $(dv/dt)_c$ at the time of commutation in modes I and III, and the critical current/unit of time (di/dt) in mode I.

The semiconductor device according to this invention comprises a first semiconductor layer of a first conductivity type, a second semiconductor layer of a second conductivity type, which is laid upon said first semiconductor layer, a third semiconductor layer of the first conductivity type, which is laid upon said second semiconductor layer, a first emitter region of the second conductivity type, with a predetermined pattern, said first emitter region being formed in said first semiconductor layer and forming therein a plurality of islands of the first semiconductor, as viewed in the laying direction of said layers, a second emitter region of the second conductivity type, with a predetermined pattern, said second emitter region being formed in said third semiconductor layer and forming therein a plurality of islands of said third semiconductor layer, as viewed in the laying direction of said layers, an auxiliary emitter region of the second conductivity type, which is formed in said third semiconductor layer, a first main electrode formed on the exposed major surface of said first semiconductor, said first main electrode being in contact with said first semiconductor layer and first emitter region, a second main electrode formed on the exposed major surface of said third semiconductor layer, said second main electrode being in contact with said third semiconductor layer and second emitter region, a gate electrode formed on said exposed major surface of said third semiconductor layer, and said first emitter region and second emitter region being arranged with overlapping portion and a separating portion, these portions being located close to said gate electrode, as viewed in the laying direction of said layers.

BRIEF DESCRIPTION OF THE DRAWINGS

FIGS. 1A to 1C are views illustrating a conventional triac, in which FIG. 1A is a top view of the triac.

FIGS. 4A to 4C show characteristics of the triac of FIGS. 1A to 1C, in which

FIGS. 5A to 5C illustrate the embodiment employed when the present invention is applied to a triac, in which

FIGS. 7A to 7C show characteristics of the triac of FIGS. 5A to 5C, in which FIGS. 8A to 8D illustrate another embodiment employed when the present invention is applied to a triac, in which

DETAILED DESCRIPTION OF THE PREFERRED EMBODIMENTS

A first embodiment of a semiconductor device according to the present invention may be described as follows, with reference to FIGS. 5A to 5C, FIGS. 6A to 6D and FIGS. 7A to 7C. In the first embodiment, the present invention is applied to a triac. First to fourth gate trigger modes I to IV of the triac, and polarities of the potentials at the main terminals T1, T2 and the gate terminal G of the triac, in those modes, are as tabulated below.

| TRIGGER MODE | T1 | T2 | G |
|---|---|---|---|
| I (FIG. 6A) | (−) | (+) | (+) |
| II (FIG. 6B) | (−) | (+) | (−) |
| III (FIG. 6C) | (+) | (−) | (−) |
| IV (FIG. 6D) | (+) | (−) | (+) |

The potential polarity of the gate terminal G is set in relation to the potential polarity at the main terminal T1.

Figure 7A:
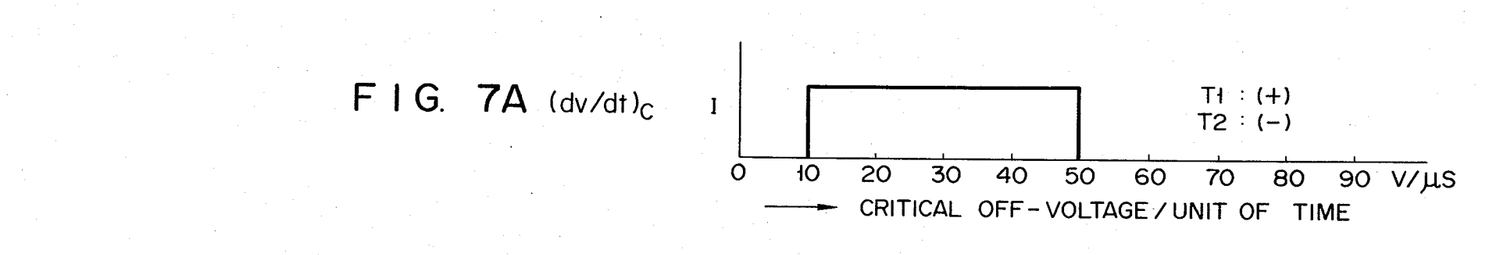
FIGS. 7A to 7B illustrate the critical off-voltage/unit of time $(dv/dt)_c$ at the time of commutation in modes I and III.
Figure 7B:
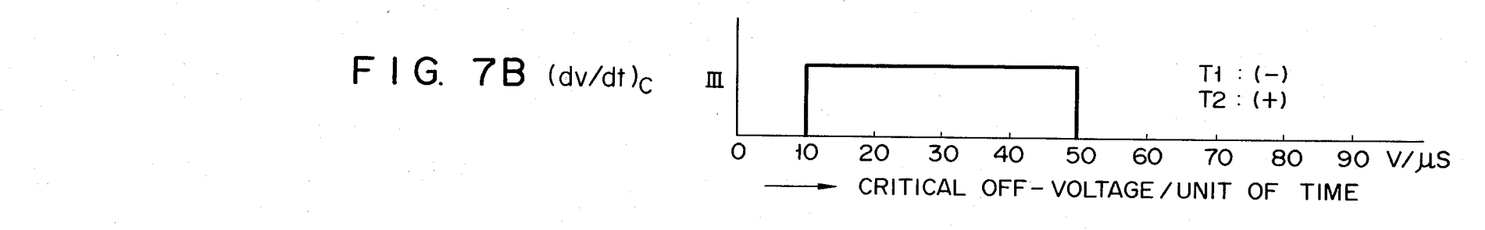
Figure 7C:
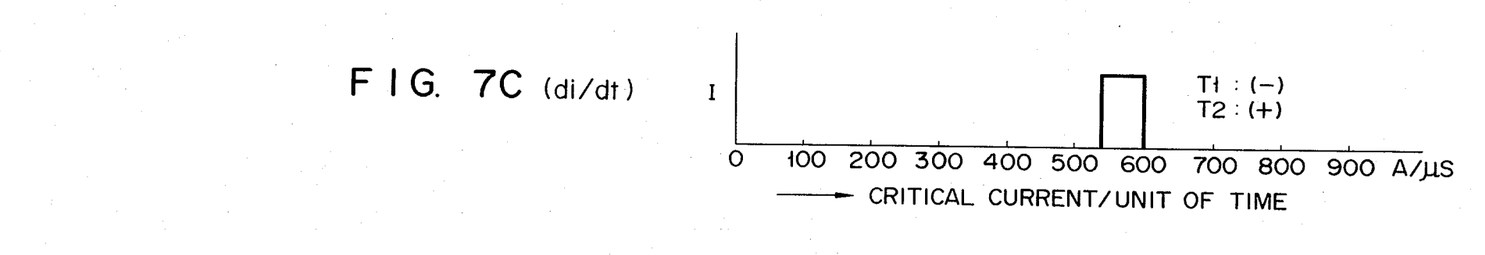
FIG. 7C illustrates the critical current/unit of time $(di/dt)$ in mode I.

FIGS. 7A and 7B illustrate the critical off-voltage/unit of time $(dv/dt)_c$ at the time of commutation in mode I, in which the potential polarity at main terminal T1 is positive (+) set with respect to that at main terminal T2; and, in mode III, in which the potential polarity at main terminal T1 is negative (−) set with respect to that at main terminal T2. In FIGS. 7A and 7B, the abscissa represents the changing rate of the voltage per 1 µsec. FIG. 7C represents the critical current/unit of time $(di/dt)$ in mode I, in which the potential polarity at main terminal T1 is negatively (−) set with respect to that at main terminal T2. In FIG. 7C, the abscissa represents the current changing rate per 1 µsec.

Figure 5A:
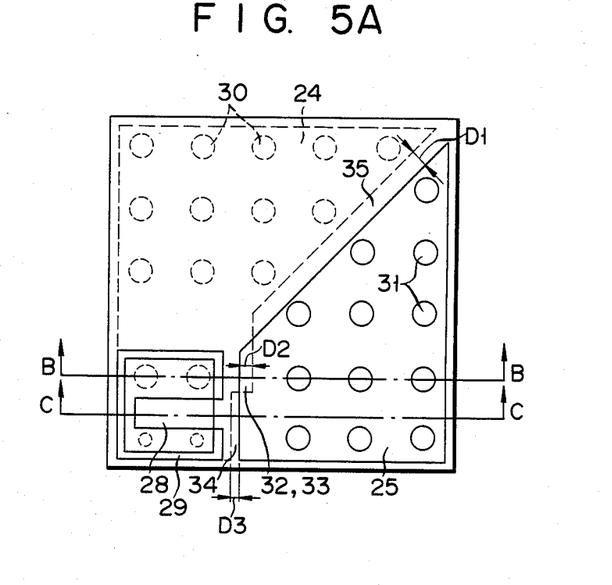
FIG. 5A is a top view of the triac.
Figure 5B:
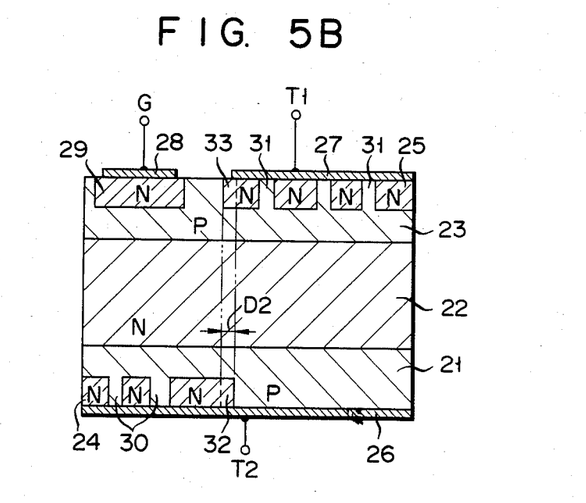
FIGS. 5B and 5C are cross-sectional views taken along lines B—B and C—C of FIG. 5A.
Figure 5C:
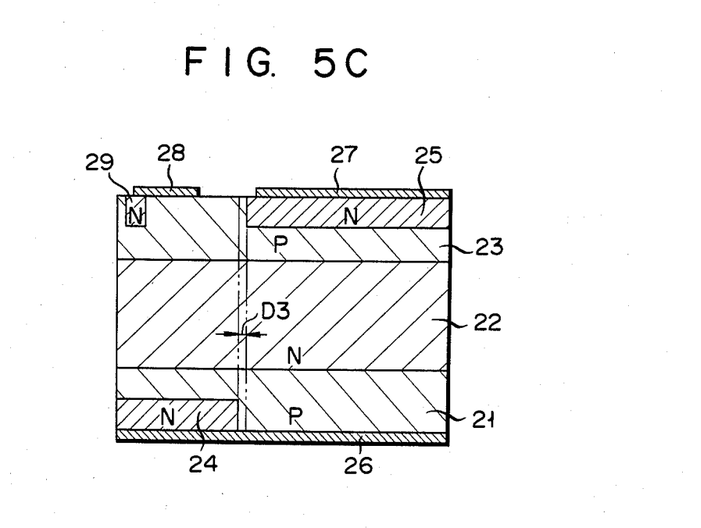

As well illustrated in FIGS. 5B and 5C, first to third semiconductor layers 21 to 23 with different conductivity types are superimposed one upon another. Specifically, a second semiconductor layer 22 of an N conductivity type is superimposed on a first semiconductor layer 21 of a P conductivity type. A third semiconductor layer 23 of a P conductivity type is superimposed on the second semiconductor layer 22. A first emitter region 24 of an N conductivity type, which is patterned as indicated by the dotted line of FIG. 5A, is formed in the first semiconductor layer 21. A plurality of islands 30 of the first semiconductor layer 21 are formed in the pattern of the first emitter region 24, as viewed in the laying direction of the layers 21 to 23.

A second emitter region 25 of an N conductivity type is formed in the third semiconductor layer 23. The second emitter region 25 is so patterned that a plurality of islands 31 of the third semiconductor layer 23 are formed in the second emitter region 25, as viewed in the same direction. An auxiliary emitter region 29 of an N conductivity type is also formed in the third semiconductor layer 23.

Entirely formed on the exposed major surface of the first semiconductor layer 21 is a main electrode 26 which is in contact with both the first semiconductor layer 21 and first emitter region 24. A main electrode 27, which is in contact with the third semiconductor layer 23 and second emitter region 25, is formed on the exposed major surface of the third semiconductor layer 23. A gate electrode 28 formed on the exposed major surface of the third semiconductor layer 23 comes into contact with the auxiliary emitter region 29 and third semiconductor layer 23.

The auxiliary emitter region 29, in a gate trigger mode wherein the gate terminal G is set at a negative potential, serves as an emitter of the auxiliary thyristor. The gate terminal G is connected to the gate electrode 28. Main terminals T1 and T2 are respectively connected to first and second main electrodes 26 and 27.

The first and second emitter regions 24, 25 partially overlap each other at substantially rectangular portion 32, 33 in the vicinity of or close to the gate region or gate electrode 28, as viewed in the laying directions of layers 21 to 23. The emitter regions 24, 25 are partially separated from each other by an elongated gap 34 (shown in FIG. 5A) or are caused to overlap each other in the vicinity of or close to the gate region or gate electrode 28, as viewed in the laying directions of layers 21 to 23. Further, the emitter regions 24, 25 are separated from or non-overlapped with each other by another elongated gap 35 (shown in FIG. 5A) which is far from the gate region, as viewed in the same direction.

Figure 5D:
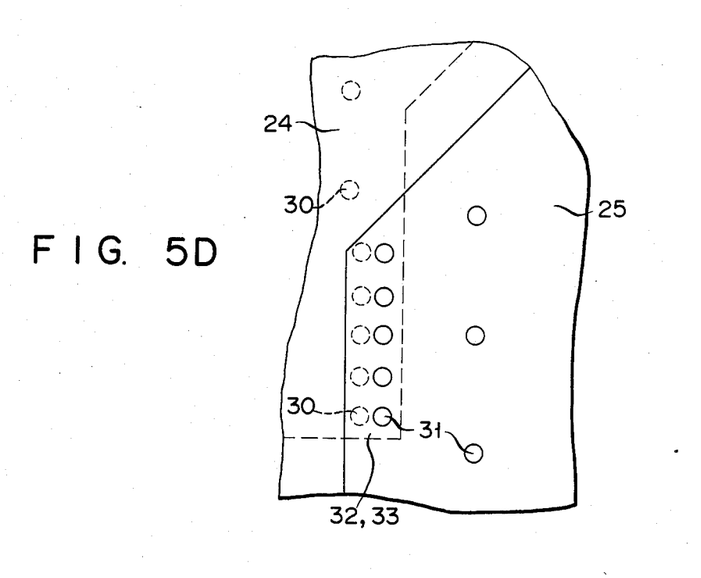
FIG. 5D is an enlarged view of a part of the triac shown in FIGS. 5A to 5C.
Figures 6A, 6B:
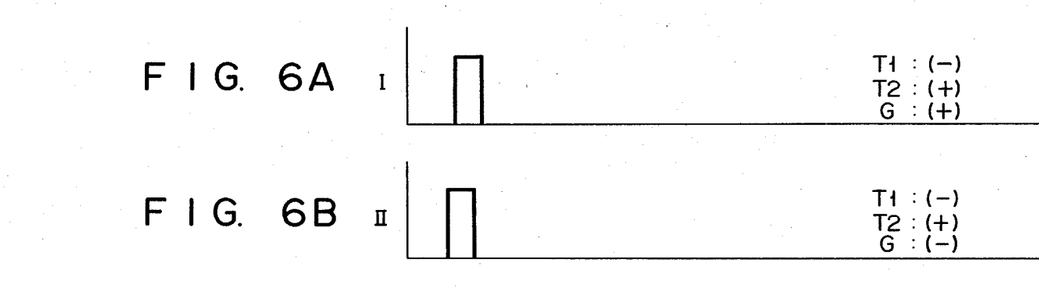
FIGS. 6A to 6D show gate trigger characteristics in four gate trigger modes I to IV of the triac shown in FIGS. 5A to 5C.
Figures 6C, 6D:
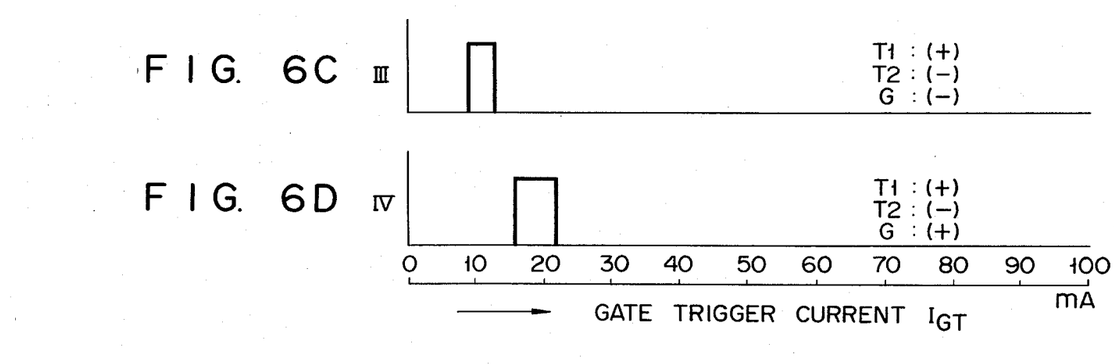

As is well illustrated in FIG. 5D, the density of the islands 30, 31 in the overlapping portions 32, 33, per unit area, is larger than that of islands 30, 31 in other portions. The elongated gap 35 has a width D1 set at a value which approximates the carrier diffusion length in the first and third semiconductor layers 21, 23. This gap is provided to prevent the turn-off error which is due to the critical off-voltage/unit of time $(dv/dt)_c$ when the triac is commutated.

As already mentioned, the gap 34 which is present between the first and second emitter regions 24, 25 improves the injection efficiency of the carrier moving into the first and second emitter regions 24, 25. This also brings about an increase in the critical current/unit of time (di/dt) in mode I, as shown in FIG. 7C. For example, the critical current in the conventional semiconductor device is very small, e.g., from 30 to 50 A/$\mu$s, while, in the present embodiment, it is very large, e.g., from 540 to 600 A/$\mu$s. Addditionally, the maximum value of the gate trigger current in all four modes is very small, being 25 mA or less.

The result of checking the critical off-voltage/unit of time $(dv/dt)_c$ at the time of commutation in modes I and III, where the polarities at the terminals of the triac are: T1(+), T2(−), and T1(−), T2(+), respectively, are illustrated in FIGS. 7A and 7B. As may be seen from these graphs, these characteristics are not much deteriorated, in comparison to those of the conventional device of FIGS. 1A to 1C, which are shown in FIGS. 4A and 4B.

When the characteristics shown in FIGS. 4A and 7A are compared for mode I, the critical off-voltage $(dv/dt)_c$ of the conventional device is from 20 to 60 V/$\mu$s, while that of the present embodiment is from 10 to 50 V/$\mu$s. Those values of both the conventional device and the present embodiment are almost within a comparable range. In mode III where T1: (−) and T2: (+), the critical off-voltage of the conventional device is from 20 to 60 V/$\mu$s, as shown in FIG. 4B. On the other hand, it ranges from 10 to 50 V/$\mu$s in the present embodiment, as shown in FIG. 7B. Those ranges are also within a comparable range, indicating that this characteristic deterioration of the present embodiment is negligible.

It should be noted that the critical current/unit of time (di/dt) of the present embodiment (FIG. 7C) is remarkably improved over that (FIG. 4C) of the conventional device. This implies that, in those characteristics, the present embodiment is improved over the prior device, as a whole. Further, the presence of the overlapping portions 32, 33 keeps the gate trigger sensitivity at a high level. Finally, the arrangement of the semiconductor device according to the present invention never increases the chip size of the device or the number of processing steps required in its manufacture.

In FIGS. 5A to 5C, the islands 30, 31 in the overlapping portions 32, 33 have been omitted, for simplicity of illustration. In FIG. 5A, these portions which are unnecessary in explaining the invention, such as the first and second main electrodes 26, 27, have also been omitted, for the same reason. Additionally, the sizes of the portions illustrated, throughout FIGS. 5A to 5C, may be strictly equal to each other, for ease of illustration.

The actual physical dimensions of each of the parts of the semiconductor device shown in FIGS. 5A to 5C, when it exhibits the characteristics shown in FIGS. 6A to 6D and 7A to 7C, will be given below. The chip size of the triac is approximately 4.2 mm$^2$. The average impurity concentration of the first and second emitter regions 24, 25 is approximately $4 \times 10^{20}$ cm$^{-3}$. Their thickness is about 17 $\mu$m. The average impurity concentration of the first and third semiconductor layers 21, 23 is about $3 \times 10^{17}$ cm$^{-3}$. The thickness of a portion of the first semiconductor 21, which is sandwiched between the second semiconductor layer 22 and the first emitter region 24, and the thickness of a portion of the third semiconductor layer 23, which is sandwiched between the second semiconductor layer 22 and the second emitter region 25, are both about 400 $\mu$m.

The average impurity concentration and the thickness of the second semiconductor layer 22 are approximately $2 \times 10^{14}$ cm$^{-3}$ and 160 $\mu$m, respectively. The width D2 of each of the overlapping portions 32, 33 of the first and second emitter regions 24, 25 is about 100 $\mu$m. The width D3 of the gap 34 is approximately 20 $\mu$m. The elongation of of gap 34 is approximately 200 $\mu$m. The islands 30, 31 are each circular, with the surface impurity concentration is being approximately $2 \times 10^{19}$ cm$^{-3}$, and further, with a diameter of about 130 $\mu$m. The whole area of the first emitter region 24 is approximately 9 mm$^2$. The whole area of the second emitter region 25 is approximately 5.6 mm$^2$. The area of each of the overlapping portions 32, 33 is approximately 0.055 mm$^2$.

Figure 8A:
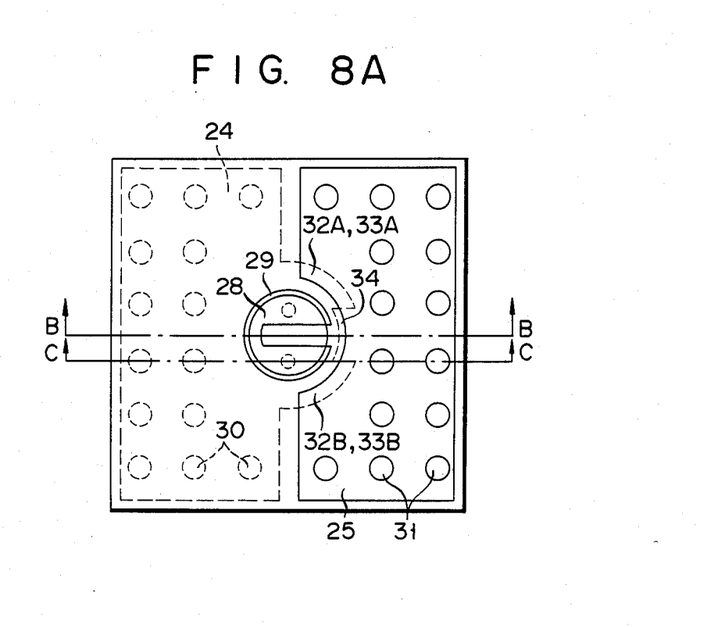
FIG. 8A is a top view of the triac.
Figure 8B:
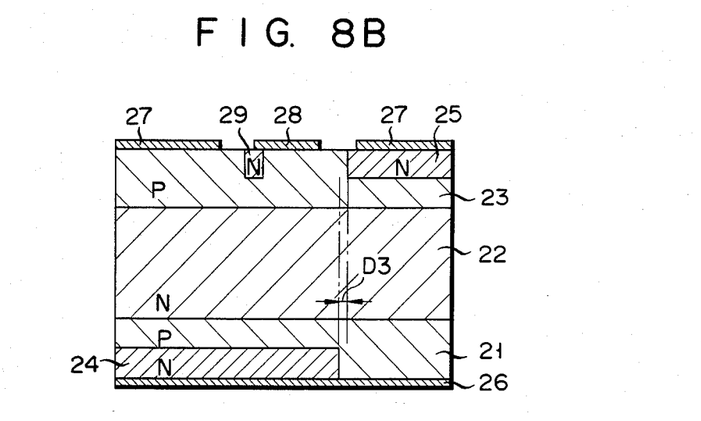
FIGS. 8B and 8C are cross-sectional views taken along lines B—B and C—C of FIG. 8.
Figure 8C:
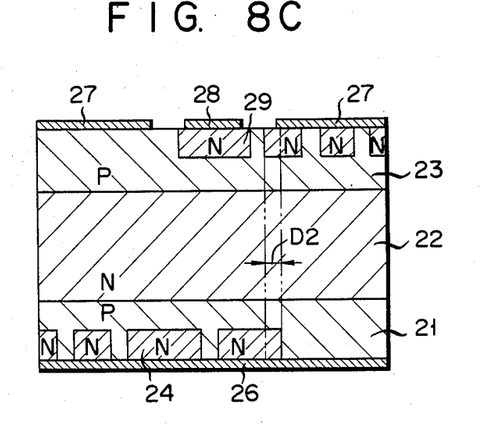
Figure 8D:
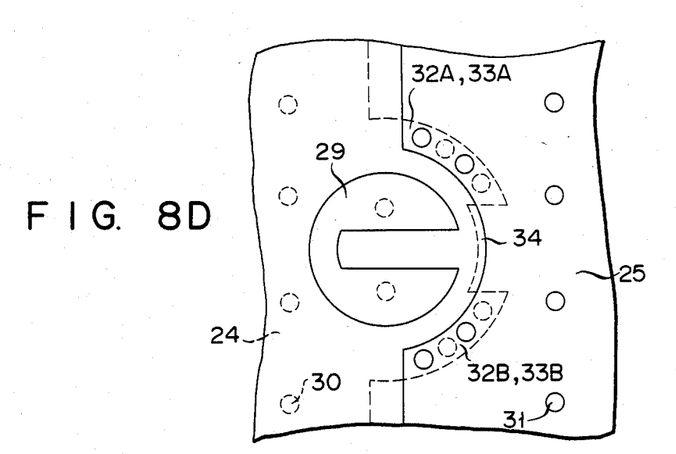
FIG. 8D is an enlarged view of a part of the triac shown in FIGS. 8A to 8C.

Shown in FIGS. 8A to 8C is a second embodiment of a semiconductor device according to the present invention. The structural arrangement of the second embodiment is roughly equal to that of the first embodiment shown in FIGS. 5A to 5C. Therefore, like reference symbols are used in designating like or equivalent portions of FIGS. 5A to 5C. The different points of the second embodiment reside in the patterns and locations of the first and second emitter regions 24, 25, the auxiliary emitter region 29 and the gate electrode 28.

As may be seen from FIG. 8A, the first and second emitter regions 24, 25 are substantially rectangular in shape, having, respectively, a semicircular convex portion at the middle of one of the longer sides and a semicircular concave portion at the middle of one of the longer sides. When viewed from the top of the drawing, those emitter regions 24, 25 are arranged in parallel with each other, while the convex portion of the first emitter region 24 partially overlaps the concave portion of the second emitter region 25 at the arced portions 32A, 33A, 32B and 33B. Further, a narrow arced non-overlapping portion 34 is present between the top of the convex and concave portions of the emitter regions 24, 25.

The auxiliary emitter region 29, which is shaped like the letter C as shown in FIG. 8A is formed in that portion of the third semiconductor layer 23 where the concave portion of the first emitter 24 is located. A circular gate electrode 28 is formed on the auxiliary emitter region 29. The gate electrode 28 comes into contact with the third semiconductor layer 23, just as in the case of the first embodiment. Further, the density of the islands 30, 31 in the overlapping portions 32A, 33A, 32B and 33B is also higher than that of the other portions. These features, i.e., the presence of the overlapping portions and the higher density of the islands therein, provide useful effects which are comparable to those of the first embodiment.

As may be seen from the foregoing, the first and second emitter regions formed on both of the major surfaces of the semiconductor layers partially overlap each other near the gate region, while having a non-overlapping gap therebetween near the same. With this arrangement, the critical off-voltage/unit of time $(dv/dt)_c$ at the time of commutation is not so greatly deteriorated. Further, the critical current/unit of time $(di/dt)$ is remarkably improved. As a result, the overall characteristics of the semiconductor device are improved.

It should be understood that the present invention is not limited to the above specific embodiment but may variously be changed and modified within the scope of the invention.

What is claimed is:

1. A semiconductor device comprising:
   a first semiconductor layer of a first conductivity type;
   a second semiconductor layer of a second conductivity type laid upon said first semiconductor layer;
   a third semiconductor layer of said first conductivity type laid upon said second semiconductor layer;
   a first emitter region of said second conductivity type, with a predetermined pattern, said first emitter region being formed in said first semiconductor layer and forming therein a plurality of first islands of said first semiconductor layer;
   a second emitter region of said second conductivity type, with a predetermined pattern, said second emitter region being formed in said third semiconductor layer and forming therein a plurality of second islands of said third semiconductor layer;
   an auxiliary emitter region of said second conductivity type formed in said third semiconductor layer, said auxiliary emitter region having a predetermined pattern defining a recess;
   a first main electrode on the exposed major surface of said first semiconductor layer, said first main electrode contacting said first semiconductor layer and said first emitter region;
   a second main electrode on the exposed major surface of said third semiconductor layer, said second main electrode contacting said third semiconductor layer and said second emitter region;
   a gate electrode on said exposed major surface of said third semiconductor layer, said gate electrode contacting said third semiconductor layer and said auxiliary emitter region; and
   when said first and third semiconductor layers are projected toward a surface parallel to said first and third semiconductor layers, a portion of said first emitter region overlaps a portion of said second emitter region, a portion of said first emitter region is separated from said second emitter region by a separating portion, said overlapping portions and said separating portion being located near said auxiliary emitter region, said separating portion facing said recess of said auxiliary emitter region.

2. A semiconductor device according to claim 1, in which the width of said separating portion between said first emitter region and said second emitter region is approximately 20 μm.

3. A semiconductor device according to claim 1, in which the width of said overlapping portions between said first emitter region and second emitter region is approximately 100 μm.

4. A semiconductor device according to claim 1, in which said separating portion is substantially rectangular.

5. A semiconductor device according to claim 1, in which said separating portion is substantially arc shaped.

6. A semiconductor device according to claim 1, in which said overlapping portions are substantially rectangular.

7. A semiconductor device according to claim 1, in which said overlapping portions are two portions substantially arc shaped.

8. A semiconductor device according to claim 1, wherein the densities of said first and second islands at said overlapping portions of said first and second emitter regions are higher than the densities of said first and second islands at the non-overlapping portions of said first and second emitter regions.

* * * * *